US008236593B2

(12) United States Patent
Arena et al.

(10) Patent No.: US 8,236,593 B2
(45) Date of Patent: Aug. 7, 2012

(54) METHODS FOR IMPROVING THE QUALITY OF EPITAXIALLY-GROWN SEMICONDUCTOR MATERIALS

(75) Inventors: Chantal Arena, Mesa, AZ (US); Subhash Mahajan, Tempe, AZ (US); Ilsu Han, Tempe, AZ (US)

(73) Assignees: Soitec, Bernin (FR); Arizona Board of Regents for and on Behalf of Arizona State University, Scottsdale, AZ (US)

( * ) Notice: Subject to any disclaimer, the term of this patent is extended or adjusted under 35 U.S.C. 154(b) by 61 days.

(21) Appl. No.: 12/600,120

(22) PCT Filed: May 14, 2008

(86) PCT No.: PCT/US2008/063567
§ 371 (c)(1),
(2), (4) Date: Dec. 16, 2009

(87) PCT Pub. No.: WO2008/141324
PCT Pub. Date: Nov. 20, 2008

(65) Prior Publication Data
US 2010/0133548 A1     Jun. 3, 2010

Related U.S. Application Data

(60) Provisional application No. 60/917,810, filed on May 14, 2007.

(51) Int. Cl.
*H01L 21/00* (2006.01)
(52) U.S. Cl. .................. 438/44; 438/481; 257/E21.097; 257/E21.461; 257/E21.566

(58) Field of Classification Search .................... 438/38, 438/44, 481; 257/E21.097, E21.461, E21.566
See application file for complete search history.

(56) References Cited

U.S. PATENT DOCUMENTS

| 4,100,014 | A | 7/1978 | Kuhn-Kuhnenfeld et al. ............................ 156/647 |
| 4,897,152 | A | 1/1990 | Chen ............................. 156/637 |
| 6,111,277 | A * | 8/2000 | Ikeda ............................. 257/99 |
| 6,803,240 | B1 | 10/2004 | Bedell et al. ..................... 438/12 |
| 7,037,741 | B2 * | 5/2006 | Tasi et al. ........................ 438/38 |
| 7,560,364 | B2 * | 7/2009 | Bour et al. ..................... 438/481 |
| 2004/0067648 | A1 | 4/2004 | Morita et al. ................. 438/689 |
| 2004/0150001 | A1 | 8/2004 | Shchukin et al. ............ 257/183 |
| 2007/0026643 | A1 | 2/2007 | Tadatomo et al. ........... 438/478 |
| 2007/0037308 | A1 | 2/2007 | Okuyama et al. ............. 438/46 |

OTHER PUBLICATIONS

International Search Report and Written Opinion of the International Searching Authority, application No. PCT/US2008/063567, mailed Dec. 1, 2008.

* cited by examiner

*Primary Examiner* — Michael Lebentritt
(74) *Attorney, Agent, or Firm* — Winston & Strawn LLP (57) ABSTRACT

The invention provides methods which can be applied during the epitaxial growth of two or more layers of semiconductor materials so that the qualities of successive layer are successively improved. In preferred embodiments, surface defects present in one epitaxial layer are capped with a masking material. A following layer is then grown so it extends laterally above the caps according to the known phenomena of epitaxial lateral overgrowth. The methods of the invention can be repeated by capping surface defects in the following layer and then epitaxially growing a second following layer according to ELO. The invention also includes semiconductor structures fabricated by these methods.

16 Claims, 6 Drawing Sheets

METHODS FOR IMPROVING THE QUALITY OF EPITAXIALLY-GROWN SEMICONDUCTOR MATERIALS

This application is a 371 filing of International patent application no. PCT/US2008/063567 filed May 14, 2008, which claims the benefit of U.S. application No. 60/917,810 filed May 14, 2007.

FIELD OF THE INVENTION

The present invention relates to the field of processing semiconductor materials, and in particular to the field of epitaxial growth of high-quality semiconductor materials. The invention provides methods which improve the quality of a surface layer, and which can be applied repeatedly to successively improve the quality of the surface layer. The invention also includes semiconductor structures fabricated by these methods.

BACKGROUND OF THE INVENTION

To be suitable for device fabrication, layers of semiconductor materials must have high purity and low density of defects or dislocations. Preparation of quality layers of certain materials, especially compound materials, has been hindered in the past because of a lack of both quality bulk, single crystals, from which individual layers of useful sizes can be sliced, and also of adequate substrates for heteroepitaxial growth of quality layers, from which epitaxial layers can be transferred.

For example, such problems have hindered the development of semiconductors including gallium nitride (GaN); of other Group III nitrides, including, e.g., AlN, InN, GaInN, and other mixed nitrides (referred to herein as "III nitrides"); of certain Group III-V compounds; and of certain other compound materials (e.g., II-VI materials) generally. For many of these materials, semiconductor-quality bulk crystals are not available, and suitable and commercially useful substrates have not been found. A suitable substrate closely matches the crystal properties of the target material to be grown; if these properties do not closely match, the resulting material usually has an unacceptable density of defects and dislocations.

Specifically, in the case of GaN, crystal quality can be improved by pre-treatment of the growth substrates, e.g., by nitridization and other chemical modifications; by growing thin, low temperature buffer layers of other III nitrides, e.g., AlN or GaN, by thermal annealing, and the like. Crystal quality has also been improved by exploiting epitaxial lateral overgrowth (ELO). Despite these advances, available GaN layers still have significant numbers of defects and dislocations.

Such problems have hindered development of alloy semiconductors, e.g., alloys of silicon (Si) and germanium (Ge), Ge layers on Si substrates, and strained Si (sSi) layers. Although crystal quality can be improved by growing these materials on buffer layers having a graded composition, room still remains for improvement.

Clearly, layers and crystals of compound and alloy semiconductors of improved quality are desirable. However, widely applicable processes for doing so are not known in the prior art.

SUMMARY OF THE INVENTION

The present invention includes methods for fabricating semiconductor structures with surface layers of improved qualities, i.e. with fewer defects and dislocations. The invention also includes semiconductor structures fabricated with the methods. The methods are now briefly described in preferred embodiments.

Beginning with a structure having a first layer (usually a semiconductor) of a first material, pits are etched (or otherwise opened up) at the locations of surface defects. Herein the word "defect" is used to refer to any departure from crystal symmetry caused by, but not limited to, free surfaces, disorder, impurities, vacancies and interstitials, dislocations, lattice vibrations, and grain boundaries. The pits are preferably sufficient large so that the disordered material is removed from the surface, but otherwise are sized and arranged such as to promote epitaxial lateral overgrowth (ELO) of the pits during epitaxial growth of a subsequent layer. Accordingly, the sizes of surface openings are such that they can be overgrown by ELO and the pits are arranged such that the intact surface serves as an adequate substrate for ELO.

Although disordered material has been removed and the intact surface away from the pits has an ordered crystal structure, the walls of the pits, especially their portions towards the bottom of the pit, may remain more or less disordered. For example, the pits may be the surface emergence of defects within the interior of the first layer. Such disordered material is occluded by capping the pits with caps comprising a masking material. The caps are formed by depositing, or by growing, or by otherwise placing masking material on the surface of the layer so as to occlude the surface openings of the pits and cover any exposed portions of the walls of the pits, but so as those intact portions of the surface away from the pits are exposed. The masking material in, or on (or closely adjacent to) the surface opening of a pits is referred to as the "cap".

After etching and capping (generally, surface preparation), only ordered portions of the surface of the first layer remain exposed: the pits replace the originally disordered portions and any disordered portions of the pits themselves is occluded with a cap of masking material. Therefore, a layer of a suitably selected semiconductor second material, that is epitaxially grown on the prepared surface, can be expected to have fewer defects and dislocations than the first layer and therefore it can be expected to have a higher quality.

Firstly, the second material should be able to grow as an ordered crystal layer from an ordered substrate of the first material, e.g., both materials should have closely similar crystal properties. In preferred embodiments, the first and second materials are substantially the same, or at least are chemically substantially similar (e.g., AlN and GaN). Secondly, the second material should be capable of ELO so that the caps can be overgrown without inducing defects or dislocations in the semiconductor layer. Preferably, the masking material is selected to promote ELO by the second material.

The invention has application to a wide range of semiconductor materials and combinations thereof, both elemental semiconductors and compound semiconductors. For example, it can be applied to combinations of Si (silicon) with strained Si (sSi) and/or Ge (germanium), and to group II-VI and group III-V semiconductor materials. Suitable etchants for these embodiments are described in, e.g., U.S. Pat. Nos. 6,803,240; 4,897,152; and 4,100,014. Particular applications are to growing pure or mixed nitrides of the group III metals (III nitrides) Al, Ga, and In, e.g., AlN, GaN, InN, AlGaN, GaInN, and especially to low-defect-density, monocrystalline GaN layers.

Accordingly, for conciseness and convenience only and without limitation, the following description and figures reflect common characteristics of the III nitrides, particularly of GaN. For example, III nitrides are often necessarily grown on substrates that do not have closely matching crystal properties. The growing III nitride layer therefore often has numerous defects and dislocations (generally regions of disordered crystal structure) originating at the substrate interface, continuing into the growing layer, and emerging as surface defects.

However, layers epitaxially grown by the methods of this invention will have improved qualities because surface defects or dislocations (generally surface regions of disordered crystal structure) in lower or substrate layers are capped.

More specifically, the present invention provides methods for reducing defects and dislocations during fabrication of a semiconductor structure. These methods include the steps of fabricating a semiconductor structure with a layer having an exposed surface, the exposed surface having a plurality of defects or dislocations; and capping a plurality of the exposed defects and dislocations with caps comprising a masking material, the masking material of the caps replacing a portion of the semiconductor layer at the locations of the capped surface defects and dislocations. In preferred embodiments, a following semiconductor layer is epitaxially growing on the exposed surface; and the caps are sized and arranged to facilitate epitaxial lateral overgrowth of the following layer over the caps. Also, the steps of capping and growing are repeated one or more times.

Capping the defects or dislocations preferably first forms pits at some or all of the surface defects and dislocations, the pits extending into the semiconductor layer, and then occludes the surface openings of some or all of the pits by filling at least a portion of the pits with the masking material. In preferred embodiments, pits are formed by etching the exposed surface preferentially at the defects or dislocations. Further, occluding the surface openings preferably first deposits the masking material on the etched surface, and then removes those portions of the masking material that are deposited on the surface but are not occluding surface openings of the pits. The masking material can be removed by chemical mechanical polishing, after which a surface smoothing process can be performed on the exposed surface.

Further, the present invention provides methods for reducing defects and dislocations during fabrication of a semiconductor structure including a III-V material, or specifically a III nitride material. These methods include the steps of fabricating a semiconductor structure with a layer having an exposed surface, the layer comprising a III-V material and the exposed surface having a plurality of defects or dislocations; then capping a plurality of the exposed defects and dislocations with caps comprising a masking material, the masking material of the caps replacing a portion of the semiconductor layer at the locations of the capped surface defects and dislocations; and then epitaxially growing a following semiconductor layer comprising a III-V material on the exposed surface under conditions favoring epitaxial lateral overgrowth (ELO) over the caps. In preferred embodiments, the masking material is selected to promote ELO of the following layer, and the caps are sized and arranged to promote ELO of the following layer. Again, the steps of capping and growing can be repeated one or more times.

The invention also includes semiconductor structures produced by the above methods. One such structure produced by one repetition of these methods includes a first layer having an exposed surface, the exposed surface having in turn a plurality of pits, where the pits intercept one or more defects or dislocations present in the interior of the semiconductor layer, and the pits are substantially occluded with a masking material. In preferred embodiments, this semiconductor structure further includes a second layer of a second semiconductor material on the exposed surface of the first layer. The second semiconductor layer preferably has a lower surface density of defects or dislocations than the first layer and can include gallium nitride.

A further such structure produced by two repetitions of these methods includes a first layer having a first upper face with a plurality of capped pits, the pits intercepting one or more defects or dislocations present in the interior of the semiconductor layer, and the pits being substantially occluded with a masking material; and a second layer having a second lower face contacting the first upper face, and having a second upper face comprising a plurality of pits, the pits intercepting one or more defects or dislocations present in the interior of the semiconductor layer, and the pits being substantially occluded with a masking material, wherein the second layer has a lower surface density of defects or dislocation than the first layer; and a third layer having a third lower face contacting the second upper face, and having an exposed third upper face, wherein the third layer has a lower surface density of defects or dislocation than the second layer. Additional semiconductor structures further include a plurality of second layers.

The term "substantially" is used herein to refer to a result that is complete except for the deficiencies normally expected in the art. For example, an epitaxial layer cannot routinely be expected to be completely continuous (or completely monocrystalline, or completely of one crystal polarity) across macroscopic dimensions. However, an epitaxial layer can routinely be expected to be "substantially continuous" (or "substantially monocrystalline", or "substantially of one crystal polarity") across macroscopic dimensions where the discontinuities (or crystal domains, or crystal boundaries) present are those expected in the art for the processing conditions, the material quality sought, or so forth.

Similarly, a semiconductor layer having "substantially no defects and dislocations" is used herein to mean that the semiconductor layer has a density of defects and dislocations that is at least low or a very low in comparison to what is common in the art for the material of the semiconductor layer. For example, in the case of GaN, "substantially no defects and dislocations" (or a low or very low density of defects or dislocations) is taken to refer to herein to defect or dislocation densities of less than approximately on the order of $10^5/cm^2$ to $10^6/cm^2$, and especially less than approximately on the order of $10^5/cm^2$. The defect density in the group III nitrides is measured by methods well know to those familiar in the art, including, atomic force microscopy, optical microscopy, scanning electron microscopy and transmission electron microscopy. The preferred method for measuring the defect density is by transmission electron microscopy (TEM).

Other examples include semiconductors comprising Ge and Si. In the case of Ge and Si, e.g., $Si_{1-y}Ge_y$ where y>0.2, "substantially no defects and dislocations" (or a low or very low density of defects or dislocations) is taken to refer to herein to defect or dislocation densities of less than approximately on the order of $10^3/cm^2$ to $10^4/cm^2$, and especially less than approximately on the order of $10^3/cm^2$. In the case of applications to Ge on Si "substantially no defects and dislocations" (or a low or very low density of defects or dislocations) is taken to refer to herein to defect or dislocation densities of less than approximately on the order of $10^4/cm^2$ to $10^5/cm^2$, and especially less than approximately on the order of $10^4/cm^2$.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

The methods of this invention prevent defects and dislocations that are present at an earlier stage of epitaxial growth of a semiconductor layer from being present at a following stage so that the following epitaxial layer can have improved quality. These methods can be performed once to improve the quality of the following layer, or can be performed two or more times to successively improve the quality of successive following layers. In the following, the terms "defect" and "dislocation" are used generally to refer to localized regions of disordered crystal structure regardless of their precise crystallographic description.

Briefly, methods of the invention "caps" (or bridge or cover) defects or dislocations present at the surface of a current semiconductor layer (the "current" layer and "current" surface) so that these defects or dislocations cannot continue (or propagate) into a following epitaxial layer grown on the current layer. Because the following layer grows, at least initially, above and over the caps (epitaxial lateral overgrowth (ELO)), the caps themselves do not induce defects in the following layer. In preferred embodiments, the material of the following layer is substantially the same as, or has crystal properties very closely similar to, the material of the current layer, so that the interface between these layers will induce few or no defects or dislocations in the following layer. Thereby, in preferred embodiments, the following layer has improved quality in that it has fewer defects and dislocations than are present at the current surface.

Figure 1A:
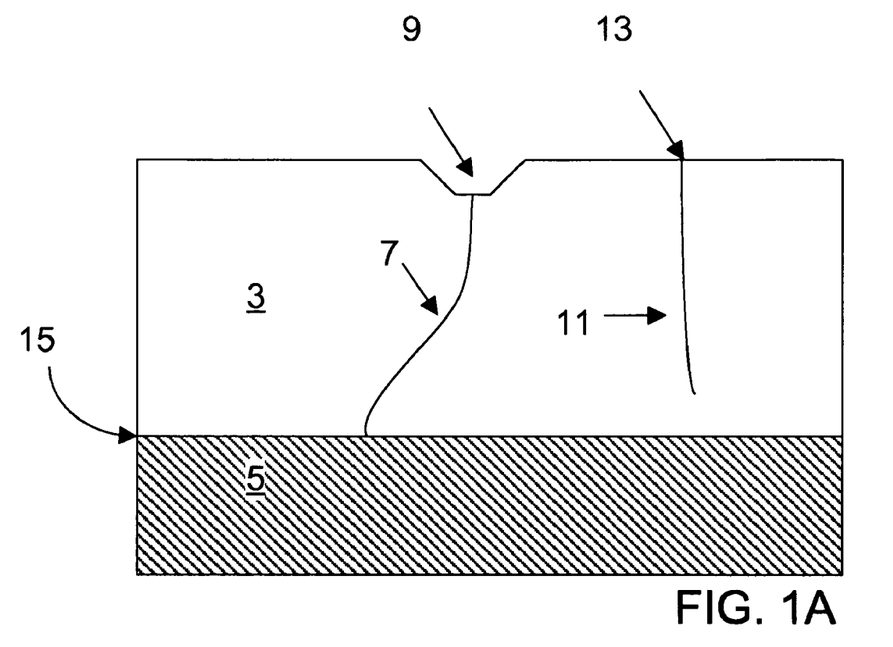
FIGS. 1A-E illustrate an iteration of the methods of an embodiment of this invention.
Figure 1B:
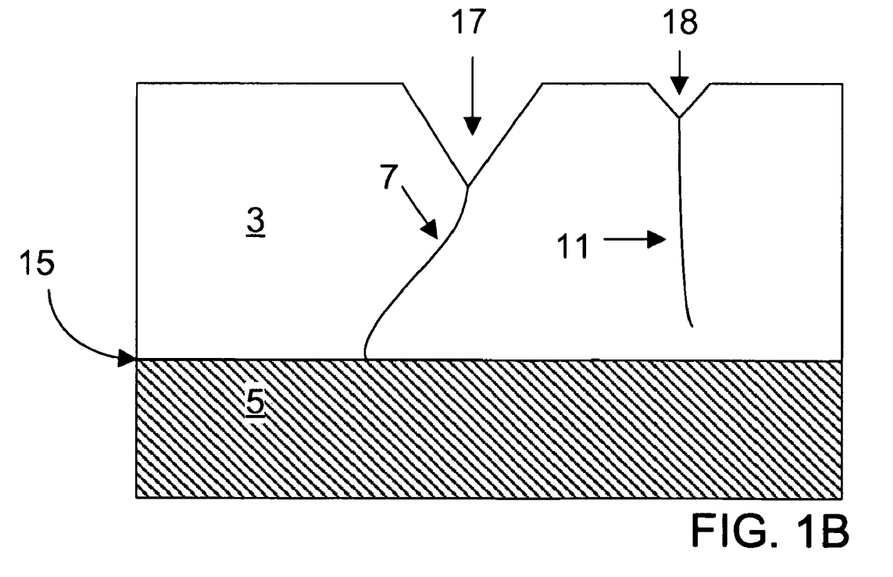
Figure 1C:
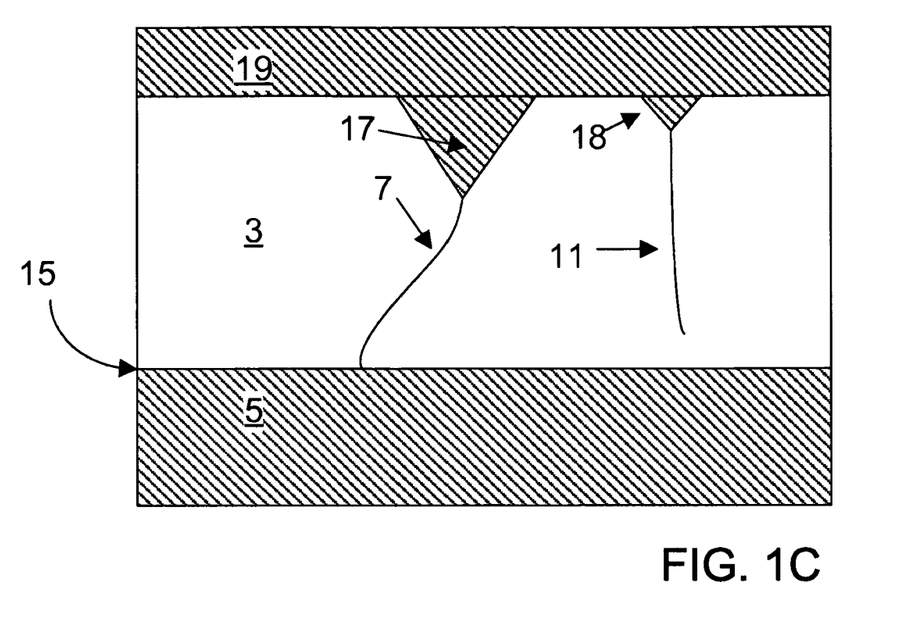
Figure 1D:
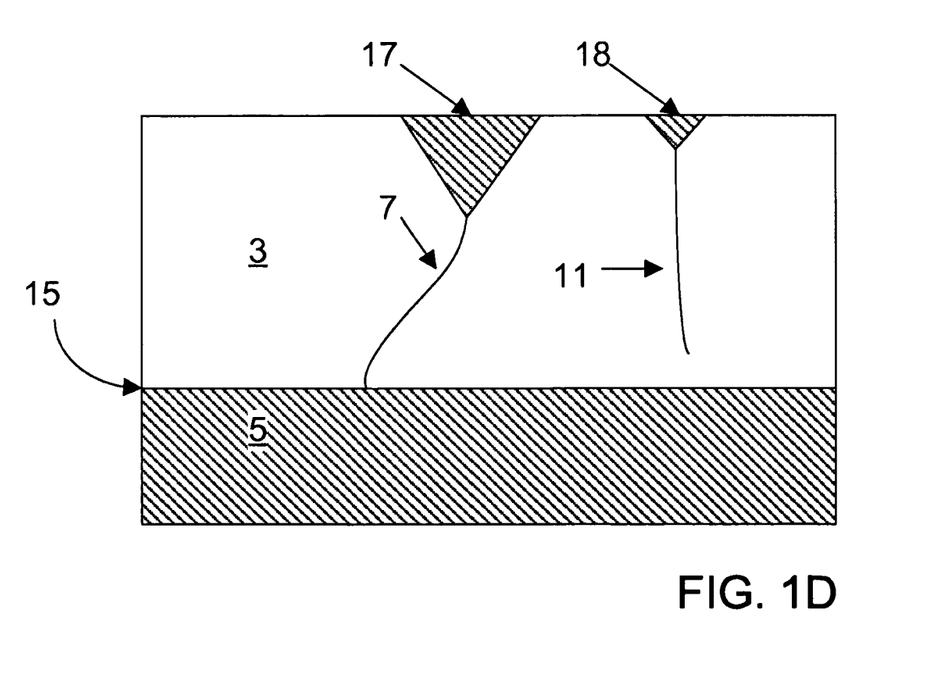
Figure 1E:
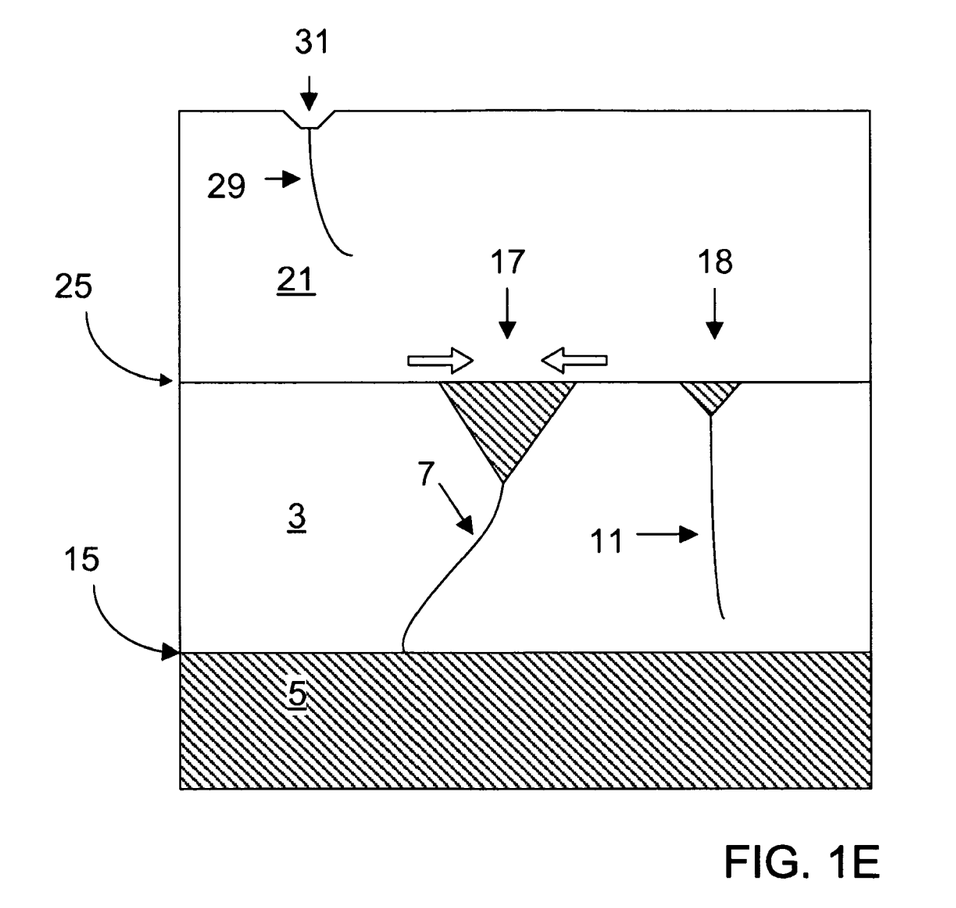

Preferred embodiments of the invention are now described with reference to FIGS. 1A-1E. These figures illustrate the principal features of preferred embodiments in a schematic and stylized manner. In particular, these figures are not to scale, illustrate exemplary defects and dislocations, and are not representative of the actual performance of this invention in improving quality. With these understandings, FIG. 1A illustrates a current semiconductor layer that has been epitaxially grown (or otherwise placed or transferred) on a substrate and that has defects or dislocations at its current surface. FIGS. 1B, 1C, and 1D illustrate a particular preferred embodiment of processes for capping the current defects and dislocations with a masking material. FIG. 1E then illustrates epitaxial growth of a following layer on the current surface during which the material of the following layer epitaxially grows over the masking material capping the current defects and dislocations (i.e., the caps). The particular embodiment illustrated by FIGS. 1B, 1C, and 1D begins by etching pits in the current surface at or about the current defects, then by growing masking material on the etched surface, and finally by removing excess masking material.

The Methods of the Invention

In more detail, FIG. 1A illustrates current layer 3 of a (preferably) semiconductor material (referred to as the "current material") grown on substrate 5 during an initial epitaxial process (or otherwise placed on substrate 5, e.g., by layer transfer. In addition, the combination of layers 3 and 5 could constitute a single layer of material such as free standing GaN or Si). Defects or dislocations 7, 11 can arise at interface 15 between the current layer and the substrate, often because, the crystal properties (and other physical properties) of the current material do not sufficiently closely match those of the material of substrate 5 (or substrate on which layer 3 is grown). These defects and dislocations can continue (or "propagate") along with the growing material into current layer 3 and disturb the crystal structure as the defect intercepts the growing layer surface.

For example, defect/dislocation 7 emerges at surface defect 9 where the structure of the current surface is more significantly disturbed (in comparison to a defect-free portion of the current surface). For example, more significant disturbance can occur if defect/dislocation 7 includes multiple intertwined or converging or coalesced individual defects. In the case of GaN, defects and dislocations 7, most commonly threading dislocations (TD), can be numerous in layers epitaxially grown on sapphire substrates. Defects and dislocations 11 can also arise in the bulk of the growing semiconductor material and continue or propagate along with the growing layer to emerge 13 at the current surface but less significantly disturb the surface. It should be noted that any defect, however originated, can emerge with greater or lesser surface disturbance. A greater disturbance can include, as illustrated by emergence 9, pits, or depressions, or the like, that are apparent on unaided examination. A lesser disturbance can include, as illustrated by emergence 13, no surface changes apparent on unaided examination. Such changes must be made apparent by an, e.g., etching process.

The methods of the invention prepare the current surface of layer 3 for the subsequent epitaxial deposition of a following layer, illustrated in FIG. 1E, by capping most or all of the surface defects with a masking material (providing or placing caps of a masking material). The surface of current layer 3 (the current surface) away from the capped defects will therefore be relatively free of defects or dislocations (compared to layer 3 as a whole prior to capping). In order that the following layer is of higher quality, i.e., having fewer defects or dislocations, than current layer 3 as a whole prior to capping, the following layer should nucleate on, and grow from, these relatively defect-free portions of the current surface. Then, only these relatively fewer surface defects or dislocations will continue (or propagate) into the following layer, which accordingly has a higher quality than layer 3 since it has relatively fewer defects or dislocations.

For the same reasons, the following layer should not nucleate on and should not grow from the masking material of the defects caps, because this material, like the material of substrate 5, can be expected to induce numerous defects in the following layer. Instead, during epitaxial growth of the following layer, it is highly preferable that the growing material extends over the defect caps, and not vertically from the caps, in an ELO-like manner. Accordingly, the details of the defect capping process, as illustrated in FIGS. 1B-1D, are advantageously selected to promote ELO growth over most or all of the capped defects.

Turning now to a more detailed description of the process, a particular preferred embodiment capping begins with a "defect visualization"-like step, i.e., forming apparent pits about the surface of layer 3 by, e.g., defect etching. FIG. 1B illustrates the "defect visualization" step. The surface of current layer 3 is etched ("defect etching") under etching conditions so that the material of layer 3 (the "current" material) is removed primarily or exclusively at or in the vicinity of surface defects or dislocations or disorder, but is removed little, if at all, from the defect-free portions of the surface. Pits (or recess or depressions) 17 and 18 are thereby formed at the locations of most or all of defects or dislocations on the surface of layer 3. Defect etching conditions are selected so that substantially all of the disordered material at a defect or dislocation is removed. Then, the surface opening of the pit replaces the disordered surface material. Many routine etching solutions (etchants) are known to etch surfaces preferentially in regions of disorder, and less "powerful" versions of these etchings can be used for this defect etching step. For example, these versions are, e.g., less acidic, or less basic, or less oxidizing, or the like, than their usual forms. In the case of Si, etchants useful for defect etching include, e.g., the Secco, or the Sirtl, or the Wright, or the Seiter etchants. Similar etchants have been developed for other semiconductor materials.

Portions of a surface that are less disordered may be visualized less significantly by defect etching than is otherwise achieved at portions that are more disordered. See, e.g., Physica Status Solidi (B) 228 395 (2001). Accordingly, FIG. 1B illustrates pit 17 has been formed at the more disordered surface defect 9 (FIG. 1A), which is the emergence of defect/dislocation 7 originating at the interface with substrate 5. On the other hand a less significant pit has formed in the surface at 18, which, because it is the emergence of defect/dislocation 11 that arose in the bulk of layer 3, is expected to be less disordered than the surface emergence/defect 9. It should be noted, however, that even such less significant defects can continue or propagate into following epitaxial material.

It is preferable that defect etching conditions be selected so that resulting pits are shaped, sized, and arranged in view of the subsequent ELO-like growth step. Preferred pits generally are conically or cylindrically shaped and extend down along the axis of a principal defect or dislocation, generally with their widest portions at their openings at the surface. Their interior surfaces also often have surface defects or dislocations, which can arise from defects or dislocations or disordered material at or nearby to principal defect or dislocation. The caps at the surface openings of the pits should be generally sized so that they can readily be bridged by overgrowing epitaxial material. Sizes suitable for subsequent ELO are known in the art, and in preferred embodiments, pit openings, and thus cap sizes, can be generally between approximately 0.1 µm and approximately 10 µm.

The arrangement and density of the pits should be such that sufficient surface area away from the capped pits (e.g., surface that is at least free of significant defects or dislocations or disorder) remains for subsequent epitaxial nucleation and for support of the following epitaxial layer. Generally, at least approximately 25% or more of the original area of the surface of layer 3 should remain intact and free of caps (and pits), and preferably at least approximately 50% or more, and more preferably at least approximately 75% or more. It is readily apparent that preferred pit sizes and preferred proportions of pit free surface place bounds on the number of surface defects of dislocations that can be present on the current surface, i.e., the average area of the surface openings of the pits times the surface density of defects of dislocations must be less than the preferred percentage of pit and cap free area of the surface. For example, if approximately 50% or more of the original surface is to preferably remain free of pits, and if the average surface openings of the pits are to be approximately 5 µm, then the surface defect or dislocation density prior to etching and masking must be less than approximately $3 \times 10^6 / cm^2$. And, if again approximately 50% or more of the original surface is to remain free of pits, but if the average surface openings of the pits are approximately 1 µm, then the surface defect or dislocation density must be less than approximately $2 \times 10^8 / cm^2$. There is a tradeoff between the size of pit openings and the density of surface defects and dislocations.

After pits with preferred structures and arrangements have been etched about most or all of the defects and dislocations on the current surface of layer 3 pits are capped with masking material. The caps can be formed by epitaxially growing, depositing, or otherwise placing (e.g., by a mechanical process) a masking material so as to, preferably fully, occlude the surface openings of substantially all or of all the pits. In most cases, this growing, depositing, or placing will also largely fill the pits so that a "plug" of making material is formed in the body of the pits. Also, as the sides of the pits can be expected to have surface defects or dislocations which can induce defects or dislocations in the following layer, it is preferable that the surface openings be occluded so that no portions of the pits remain accessible for subsequent epitaxial growth. The masking material should also preferably remain at or below the surrounding surface (e.g., protruding no more than approximately 0.1 µm above this surface). For example, the uppermost surface of the masking material can have a gently scooped-out shape so that top of the masking material has the approximate shape of a shallow saucer with the sides of the pits remaining covered.

Masking materials are preferably selected to promote overgrowth of the following layer. The material of the following layer (the following material) should not readily nucleate on, or grow directly on the masking material (at least in comparison to the current material), so that the following layer epitaxially overgrows all or substantially all of the capped defects. Growth directly on the masking material of the caps will usually induce defects in the following layer. Preferred masking materials are selected in view of the following material and to promote ELO. For example, where the current material is GaN, preferred masking materials generally comprise Si, such as silicon nitrides, silicon oxides and the like. Also, if two or more masking materials that encourage ELO are available, the preferred choice among them is that one which is easiest to remove in the subsequent removal step.

In preferred embodiments, capping the pits comprises the two steps illustrated in FIGS. 1C and 1D. First, the selected masking material is grown, or deposited, or placed, or the like across the current surface so that the surface openings of the pits are fully occluded, or capped, or optionally filled. Next, excess masking material is removed so that the portions of the current surface away from the capped pits (e.g., surface that is substantially free of significant defects, dislocations, and disordered regions) are exposed for further epitaxial growth and so that only the pits remain capped by masking material. FIG. 1C illustrates the first step. Masking material 19 has been grown, or deposited, or placed over the surface of layer 3 so that pits 17 and 18 are largely filled and the surface openings and the sides fully covered with masking material 19. In most embodiments, it is convenient to epitaxially grow masking material 19, in which case it is preferable that the epitaxial process used for the masking material be compatible with the epitaxial process used to grow the following. For example, if the following layer is grown by a vapor phase epitaxy (VPE)

in a certain reactor, it is preferable that the mask material also be grown by VPE process in the same reactor.

FIG. 1D illustrates the second step. Excess masking material 19 has been removed so that the portions of the surface of layer 3 that are free of at least substantially all significant defects or dislocations are exposed, but so that pits 17 and 18 remain capped and their openings and sides remain occluded. Here, pits 17 and 18 are largely filled with the masking material. The removal of the masking material can be accomplished utilizing a variety of methods including chemical etching, plasma etching (e.g. Reactive Ion Etching, Inductively Coupled Plasma etching) and in preferred embodiment chemical mechanical polishing (CMP). The CMP conditions, in particular the slurry abrasives and chemistry, are preferably chosen as known in the art so that masking material 19 is more readily removed than the material of layer 3. Should the action of CMP scoop out some of the uppermost portions of the masking material in pits 17 and 18, it is preferred that the sides of the pits nevertheless remain fully covered.

In an ideal case the CMP process should result in little or no roughening of the surface of layer 3. However, if the abrasive action of the CMP process results in the abrasion of the surface 3 then the layer will require a post CMP smoothing process. In the case of III-V nitrides, the roughened surface can be smoothed by mass transport regrowth methods known in the art. In preferred embodiment the sample is heated in an $NH_3+H_2$ ambient to a temperature that promotes mass transport regrowth. During mass transport regrowth the high energy peaks in the material are redistributed into the valleys of the material resulting in a smoothing action and a surface more suitable for subsequent ELO. See, e.g., Japanese Journal of Applied Physics Part 1 40 565 (2001) and Applied Surface Sciences 159-160 421 (2000).

Specifically, FIG. 1D illustrates that the surface emergence of more significant defect 7 or dislocation has been etched and capped. In addition the surface emergence 13 of less significant defect 11 has also been etched and capped 18.

FIG. 1E illustrates that, once substantially all or all of the etched surface defects or dislocations having been capped with caps that promote ELO, following layer 21 of a following material is now epitaxially grown. At least until the capped defects have been overgrown and bridged by growing layer 21, conditions are preferably selected to promote ELO as known in the art. Subsequently conditions can be changed to promote routine vertical growth. It is preferred that the following material have relevant properties closely similar to those of the current material, so that few if any defects will arise at interface 25 between layer 3 of the current material and the following layer 21 of the following material. Thereby, following layer 21 will have better quality, i.e., fewer defects and dislocations, than current layer 3. In many embodiments, the following material of layer 21 is substantially the same as the current material of layer 3.

In more detail, more significant defect 7 does not continue into layer 21 because it has been capped 17 with masking material. Further, the cap does not itself cause defects or dislocations in layer 21 because, as the opposed arrows indicate, this layer has grown over cap 17. In addition the less significant defect 11 does not continue into the layer because it has been etched and capped 18 with masking material and overgrowth in the same manner as defect 7. For illustrative purposes, new defect or dislocation 29 is illustrated as arising in the bulk of layer 21. This defect or dislocation is illustrated as emerging at relatively significant surface defect 31.

In summary and for the reasons explained above, layer 21 has at least fewer, and often significantly fewer, defects and dislocation than layer 3. It should be understood that FIG. 1E is for illustrative purposes only and is not intended to represent the actual performance of this invention.

Further Embodiments of the Methods of the Invention

Figure 2A:
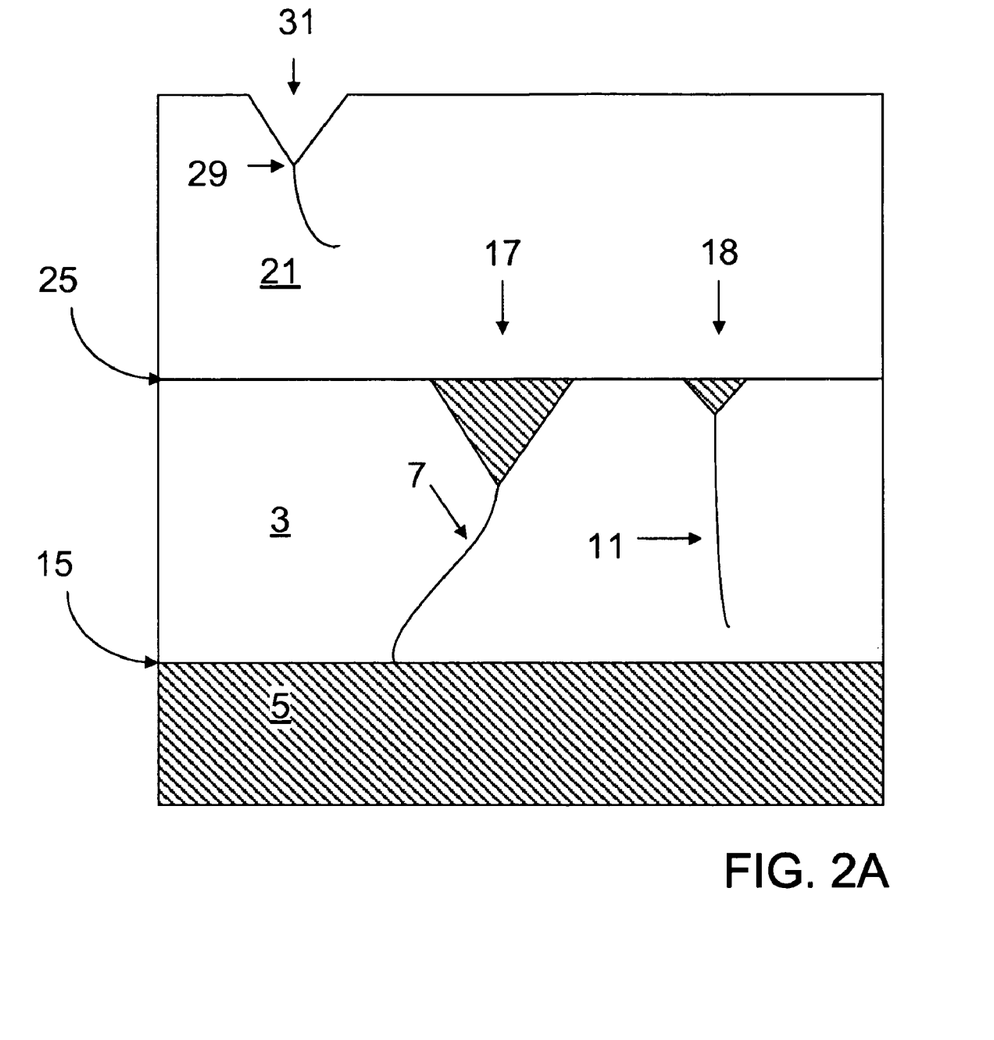
FIGS. 2A-C illustrates a further iteration of the methods of an embodiment of this invention.

In further advantageous embodiments, the methods described above can be performed two or more times so that the successively following layers have successively improved qualities. As an example of such embodiments, FIGS. 2A, 2B, and 2C illustrate a second use of these methods on a structure which in turn resulted from a first use of these methods.

For purposes of illustration, the methods are demonstrated as being further applied to the structure of FIG. 1E. The structure of FIG. 1E is fabricated from the structure of FIG. 1A by application of the methods of this invention by capping 17 and 18 (or by providing caps) for most or all of the defects and dislocations 7 and 11 in layer 3 so that they do not continue or propagate into following layer 21. Thereby, following layer 21 has fewer, or even considerably fewer, defects and dislocations than layer 3 and is therefore of improved quality. However a number of new defects and dislocations 29 can originate in the bulk of layer 21 and emerge 31 at the surface of layer 21.

To apply the methods of this invention a second time, steps corresponding to and similar to the steps illustrated in FIGS. 1B-1E are performed on the structure of FIG. 1E. Thus, corresponding to FIG. 1B, FIG. 2A illustrates defect etching of the surface defects or dislocations (or generally, surface regions of disordered crystal structure) of FIG. 1E in a manner similar to the previous defect etching. In particular, it is preferable that defect etching conditions be selected so that resulting pits are shaped, sized, and arranged in view of and to promote the subsequent ELO-like growth step. As a result, pits 31, which is similar to pits 17 and 18, has been etched at the corresponding surface defects.

Figure 2B:
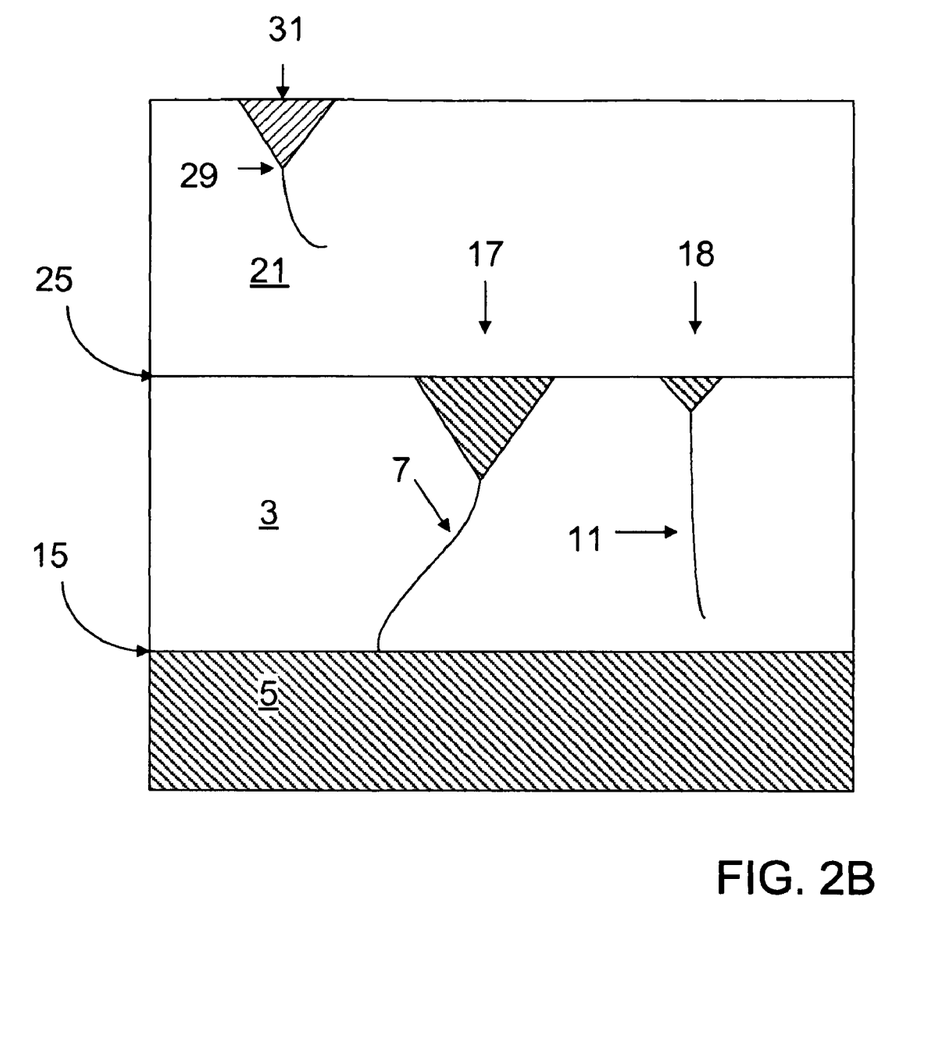
Figure 2C:
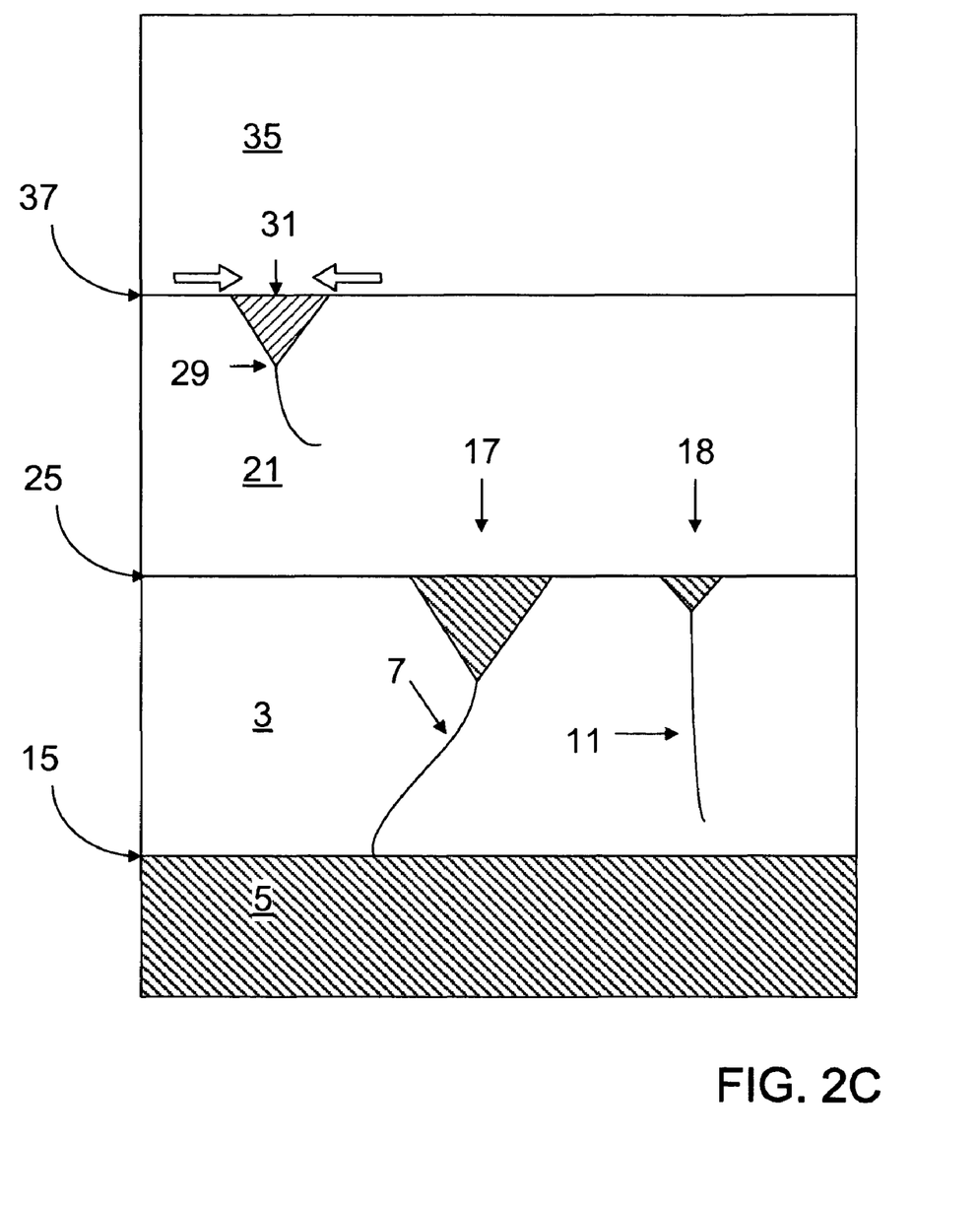

Next, corresponding to FIG. 1D, FIG. 2B illustrates that pit 31 is capped with a masking material (substantially the same as or different from the previous masking material). As previously, it is preferable that the surface openings and walls of the pits be occluded so that no portions remain accessible for subsequent epitaxial growth, and that the masking material should remain at or below the surrounding surface (e.g., the uppermost surface of the masking material can have a gently scooped-out shape). The masking material is preferably selected to promote overgrowth (ELO) of the epitaxial following layer.

The caps can be formed by epitaxially growing, depositing, or otherwise placing (e.g., by a mechanical process) the masking material. Preferably, the masking material is deposited according to the process of FIGS. 1C and 1D. First, the masking material is deposited, e.g., by epitaxially growth, on the surface of layer 21 at least until all, or substantially all, of the pits are fully capped. Next, excess masking material is removed, e.g., by a CMP process, to expose all, or substantially all, of the portions of the surface of layer 21 that are away from the pits (and substantially free of at least significant defect and dislocations). The caps of the pits are not removed. Should the CMP process sufficiently roughen the surface away from the caps, a subsequent smoothing step is preferred.

Finally, corresponding to FIG. 1E, once substantially all or all of the surface defects or dislocations having been capped with masking materials and cap structures that promote ELO, second following layer 35 is now epitaxially grown. FIG. 2C illustrates this step. It is preferred that the material of second following layer 35 have relevant properties (e.g., crystal properties and coefficients of thermal expansion) closely similar to those of the material of following layer 21. Then, few if any defects will arise at interface 37 between following layer 21 and the second following layer 35. More preferably, the material of second following layer 35 is substantially the same as the material of following layer 21. The epitaxial growth conditions, at least initially, are again selected as known in the art so that the second following layer overgrows and bridges capped defects 29. Subsequently conditions can be changed to promote routine vertical growth.

Thereby, the second following layer 35 will have better quality than the following layer 21, which in turn will have better quality than the current layer 3. Specifically, the densities of defects and dislocations in layer 35 are less than in layer 21, which in turn are less than in layer 3.

Semiconductor Structures Fabricated by the Methods of the Invention.

The present invention also includes the structure produced by and during the methods of the invention. Fabrication of preferred examples of these structures have already been described in connection with FIGS. 1D, 1E, 2A, 2B, and 2C. Their structural features are now summarized. Many structural details that have already been described and are not repeated here.

One structure of the invention includes a top semiconductor layer with an exposed surface and a buried surface, where the buried surface is adjacent to a buried layer at an interface between the two layers. The buried layer can be a substrate layer or another semiconductor layer. The exposed semiconductor surface includes a plurality of pits (or depressions or voids) substantially all of which intercept a defect or dislocation or disordered region interior to the top layer and possibly continuing or propagating through the top layer. The term "intercept" is used here to mean that at least one defect or dislocation terminates in the base or the sides of a pit instead of emerging at the surface of the layer, or that the pit extends into a disordered portion of the interior of the layer. Preferred structural characteristics of the pits, e.g., their sizes, shapes, and arrangements, have been described in connection with FIGS. 1B and 2A. The top layer may also include other defects or dislocations, generally less significant defects or dislocations, which emerge at the surface of the layer.

The buried layer is a semiconductor; its surface adjacent to the top layer also includes a plurality of pits (or depressions or voids) substantially all of which intercept a defect or dislocation continuing or propagating through the buried layer. Substantially all of these pits are occluded with a masking material in the manner already described, namely their surface openings and walls are fully occluded with masking material so that no portions remain accessible for subsequent epitaxial growth, and the masking material preferably remains at or below the surrounding surface (e.g., the uppermost surface of the masking material can have a gently scooped-out shape). Otherwise, these pits have the structural properties already described in connection with FIGS. 1B and 2A.

Further similar structures of the invention can include two or more of the above-described buried layers.

A further structure of the invention includes a top semiconductor layer with an exposed surface similar to the just-described surface of the buried semiconductor layer of the first structure. Specifically the example surface includes a plurality of pits (or depressions or voids) having the structural properties already described in connection with FIGS. 1B and 2A. Substantially all of these pits intercept a defect or dislocation continuing or propagating through the top layer. Substantially all of these pits are occluded with a masking material in the manner already described.

Further similar structures of the invention can include one or more buried semiconductor layers having buried surface with the above-described such occluded pits.

Further structures of the invention include of the above-described structures on the surface of which has been grown a following epitaxial layer. The following epitaxial layer buries the surface of the second structure. Specifically, the following layer has been grown so that is has extended above the capped pits so that few of no defects or dislocations can arise in the following layer from the masking material of the caps.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for reducing defects and dislocations during fabrication of a semiconductor structure comprising:
    fabricating the semiconductor structure with a semiconductor layer having an exposed surface and comprising a semiconductor material, the exposed surface of the semiconductor material having a plurality of defects and dislocations;
    capping a plurality of the exposed defects and dislocations by depositing a masking material so as to form caps comprising the masking material, the masking material of the caps replacing a portion of the semiconductor layer at the locations of the capped surface defects and dislocations;
    removing the deposited masking material from the exposed surface of the semiconductor material by chemical mechanical polishing;
    smoothing roughness of the exposed surface of the semiconductor material subsequent to the removing of the deposited masking material; and
    epitaxially growing a following semiconductor layer on the smoothed exposed surface.

2. The method of claim 1 wherein the caps are sized and arranged to facilitate epitaxial lateral overgrowth of the following layer over the caps.

3. The method of claim 1 wherein capping the defects and dislocations further comprises:
    forming pits at some or all of the surface defects and dislocations, the pits extending into the semiconductor layer; and
    occluding the surface openings of the pits by substantially completely filling the pits with the masking material.

4. The method of claim 3 wherein forming pits further comprises etching the exposed surface preferentially at the defects or dislocations.

5. The method of claim 3 wherein occluding the surface openings further comprises:
    depositing the masking material on the etched exposed surface;
    removing those portions of the masking material that are deposited on the etched exposed surface but are not occluding surface openings of the pits.

6. The method of claim 1 wherein the following semiconductor layer comprises a III-V material on the exposed surface under conditions favoring epitaxial lateral overgrowth (ELO) over the caps.

7. The method of claim 6 wherein the steps of capping and growing are repeated one or more times.

8. The method of claim 6 wherein the masking material is selected to promote ELO of the following layer.

9. The method of claim 6 wherein the caps are sized and arranged to promote ELO of the following layer.

10. The method of claim 6 wherein the following layer comprises a III nitride material.

11. The method of claim 1 wherein the semiconductor material comprises Group III nitrides, and wherein the smoothing comprises a mass transport regrowth process.

12. The method of claim 11 wherein the mass transport regrowth process comprises heating in an atmosphere comprising $NH_3$ and $H_2$.

13. The method of claim 1 wherein the steps of capping and growing are repeated one or more times.

14. The method of claim 1 wherein the steps of capping, polishing, smoothing, and growing are repeated one or more times.

15. A method for reducing defects and dislocations during fabrication of a semiconductor structure comprising:

fabricating the semiconductor structure with a semiconductor layer comprising a semiconductor material having an exposed surface, the exposed surface of the semiconductor material having a plurality of defects and dislocations;

forming pits at some or all of the surface defects and dislocations by etching, with the pits extending into the semiconductor layer which is removed by the etching;

substantially completely filling the pits by depositing a masking material to replace the semiconductor material that was etched away;

removing the deposited masking material from the exposed surface of the semiconductor material by chemical mechanical polishing;

smoothing roughness of the exposed surface of the semiconductor material subsequent to the removing of the deposited masking material; and epitaxially growing a following semiconductor layer on the smoothed exposed surface.

16. The method of claim 15 wherein the smoothing comprises heating in an atmosphere comprising $NH_3$ and $H_2$.

* * * * *